United States Patent
Otsuka et al.

(10) Patent No.: US 8,134,825 B2
(45) Date of Patent: Mar. 13, 2012

(54) CERAMIC ELECTRONIC COMPONENT AND METHOD FOR MANUFACTURING THE SAME

(75) Inventors: Hideki Otsuka, Matsue (JP); Kazuhiro Yoshida, Hikawa-gun (JP); Jun Sonoyama, Matsue (JP); Yoji Itagaki, Izumo (JP); Akihiko Nakata, Matsue (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 413 days.

(21) Appl. No.: 12/431,076

(22) Filed: Apr. 28, 2009

(65) Prior Publication Data

US 2009/0296311 A1 Dec. 3, 2009

(30) Foreign Application Priority Data

Jun. 2, 2008 (JP) ................. 2008-144746
Aug. 20, 2008 (JP) ................. 2008-211975

(51) Int. Cl.
 *H01G 4/228* (2006.01)
(52) U.S. Cl. ............... 361/306.3; 361/308.1; 361/306.1; 361/321.2; 361/328; 361/309
(58) Field of Classification Search .............. 361/308.1, 361/306.1, 306.3, 321.2, 328; 257/414
See application file for complete search history.

(56) References Cited

U.S. PATENT DOCUMENTS

| | | | |
|---|---|---|---|
| 6,288,887 B1 * | 9/2001 | Yoshida et al. ............ 361/306.1 |
| 6,704,189 B2 | 3/2004 | Yoshii et al. | |
| 6,773,827 B2 * | 8/2004 | Higuchi ................... 428/646 |
| 2003/0189817 A1 | 10/2003 | Yoshii et al. | |
| 2004/0066605 A1 | 4/2004 | Trinh | |
| 2004/0196139 A1 | 10/2004 | Nakamura et al. | |

FOREIGN PATENT DOCUMENTS

| | | |
|---|---|---|
| CN | 1450574 A | 10/2003 |
| EP | 1 353 343 A2 | 10/2003 |
| JP | 4-259205 A | 9/1992 |
| JP | 6-204096 A | 7/1994 |
| JP | 2000-306764 A | 11/2000 |
| JP | 2002-056756 A | 2/2002 |
| JP | 2003-234218 A | 8/2003 |
| JP | 2003-303736 A | 10/2003 |
| JP | 2006-049620 A | 2/2006 |

OTHER PUBLICATIONS

Official Communication issued in corresponding Chinese Patent Application No. 200910138850.7, mailed on Dec. 20, 2010.
Official Communication issued in counterpart European Search Report No. 09004990.9, mailed on Aug. 19, 2009.

* cited by examiner

*Primary Examiner* — Nguyen T Ha
*Assistant Examiner* — Hung Dang
(74) *Attorney, Agent, or Firm* — Keating & Bennett, LLP

(57) ABSTRACT

A ceramic electronic component has a ceramic element assembly, external electrodes, and metal terminals. The external electrodes are arranged on the surface of the ceramic element assembly. The external electrodes contain a sintered metal. The metal terminals are electrically connected to the external electrodes, respectively. The external electrode and the metal terminal are directly diffusion-bonded by diffusion of metal in the metal terminals into the external electrodes. The above arrangement provides a ceramic electronic component having highly reliable metal particle bonding and a method for manufacturing the same.

9 Claims, 21 Drawing Sheets

CERAMIC ELECTRONIC COMPONENT AND METHOD FOR MANUFACTURING THE SAME

BACKGROUND OF THE INVENTION

1. Field of the Invention

The present invention relates to a ceramic electronic component, and more particularly to a ceramic electronic component having external electrodes and metal terminals electrically connected to the external electrodes, and a method for manufacturing the same.

2. Description of the Related Art

In general, ceramic electronic components, such as a ceramic capacitor, are placed in an environment in which they are easily subjected to a mechanical stress in mounting or during use. For example, a stress is applied to a ceramic electronic component in some cases when a wiring board on which the ceramic electronic component has been mounted bends or when the temperature of the wiring board changes to change the volume of a wiring board due to thermal expansion, for example. Thus, when a stress is applied to a ceramic electronic component, fractures or cracks may occur in ceramic element assemblies. In view of such problems, Japanese Unexamined Patent Application Publication No. 4-259205 has proposed a method for bonding a metal terminal to an external electrode of a ceramic capacitor element using a solder containing lead in a proportion of about 80% or more and about 98% or lower, for example.

However, in recent years, the restriction of the use of certain hazardous substances in electrical and electronic equipment has rapidly proceeded as typified by the European RoHS directive or the like, and the use of a solder containing lead is becoming less acceptable. In view of this, in Japanese Unexamined Patent Application Publication No. 2003-303736, the use of a Sn—Sb high temperature solder for bonding terminal electrodes of electronic components and metal terminals, for example, has been proposed.

However, as disclosed in Japanese Unexamined Patent Application Publication No. 4-259205 and Japanese Unexamined Patent Application Publication No. 2003-303736, when external electrodes and metal terminals are soldered to each other, there has been a problem in that bonding reliability decreases due to insufficient reflow heat resistance when mounting on a substrate, deterioration of a solder itself or deterioration due to the generation of an intermetallic compound at a bonding interface under a high temperature environment or a thermal-cycle environment.

SUMMARY OF THE INVENTION

In view of the above problems, preferred embodiments of the present invention provide a ceramic electronic component having highly reliable metal terminal bonding, and a method for manufacturing the same.

A ceramic electronic component according to a preferred embodiment of the present invention has a ceramic element assembly, an external electrode, and a metal terminal. The external electrode is arranged on the surface of the ceramic element assembly. The external electrode contains a sintered metal. The metal terminal is electrically connected to the external electrode. In the ceramic electronic component according to a preferred embodiment of the present invention, the external electrode and the metal terminal are preferably directly diffusion-bonded by diffusion of metal in the metal terminal into the external electrode.

According to a preferred embodiment of the present invention, the metal terminal has a terminal body and a plating film arranged on the terminal body, in which the external electrode and the metal terminal are preferably directly diffusion-bonded by diffusion of both metal in the terminal body and metal in the plating film into the external electrode.

According to another preferred embodiment of the present invention, the plating film preferably has a lower plating film arranged on the terminal body and an upper plating film arranged on the lower plating film.

According to another preferred embodiment of the present invention, the terminal body and the lower plating film each preferably contain Ni, Fe, Cu, Ag, Cr, or an alloy containing at least one of the metals as a main component and the upper plating film preferably contains Sn, Ag, Au, or an alloy containing at least one of the metals as a main component.

According to still another preferred embodiment of the present invention, the external electrode contains Cu, Ni, Ag, Pd, or an alloy containing at least one of the metals as a main component.

According to still another preferred embodiment of the present invention, the ceramic electronic component preferably has an anti-corrosion film that covers an exposed portion of the outer surface of the external electrode.

According to still another preferred embodiment of the present invention, the external electrode and the metal terminal are preferably diffusion-bonded at a plurality of locations.

According to still another preferred embodiment of the present invention, the metal terminal is preferably diffusion-bonded to the external electrode and has a plurality of filament-like terminal portions disposed in parallel or substantially in parallel to each other.

According to still another preferred embodiment of the present invention, the ceramic element assembly preferably has a first end surface and a second end surface that are mutually opposite, the external electrode has a first external electrode that covers the first end surface and a second external electrode that covers the second end surface, and the metal terminal has a first metal terminal electrically connected to the first external electrode and a second metal terminal electrically connected to the second external electrode.

According to still another preferred embodiment of the present invention, the surface of the external electrode is not covered with a plating film.

A method for manufacturing a ceramic electronic component according to a preferred embodiment of the present invention relates to a method for manufacturing the ceramic electronic component according to another preferred embodiment of the present invention. The method for manufacturing a ceramic electronic component according to a preferred embodiment of the present invention preferably includes heating the external electrode and the metal terminal while being contacted to diffuse metal in the metal terminal into the external electrode for direct diffusion-bonding of the external electrode and the metal terminal.

According to a preferred embodiment of the method for manufacturing a ceramic electronic, a terminal for diffusion-bonding is brought into contact with the metal terminal, and applying a current a plurality of times upon heating the external electrode and the metal terminal while being contacted for diffusion-bonding thereof. Preferably, the metal terminal is heated to a temperature range in which cracks do not occur in the ceramic element assembly at a first current application among the plurality of current applications.

In the ceramic electronic component according to a preferred embodiment of the present invention, the external electrode and the metal terminal are preferably directly diffusion-bonded by diffusion of the metal in the metal terminal into the external electrode, and thus metal terminal bonding excellent in heat resistance or reliability can be achieved.

Other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

First Preferred Embodiment

Figure 1:
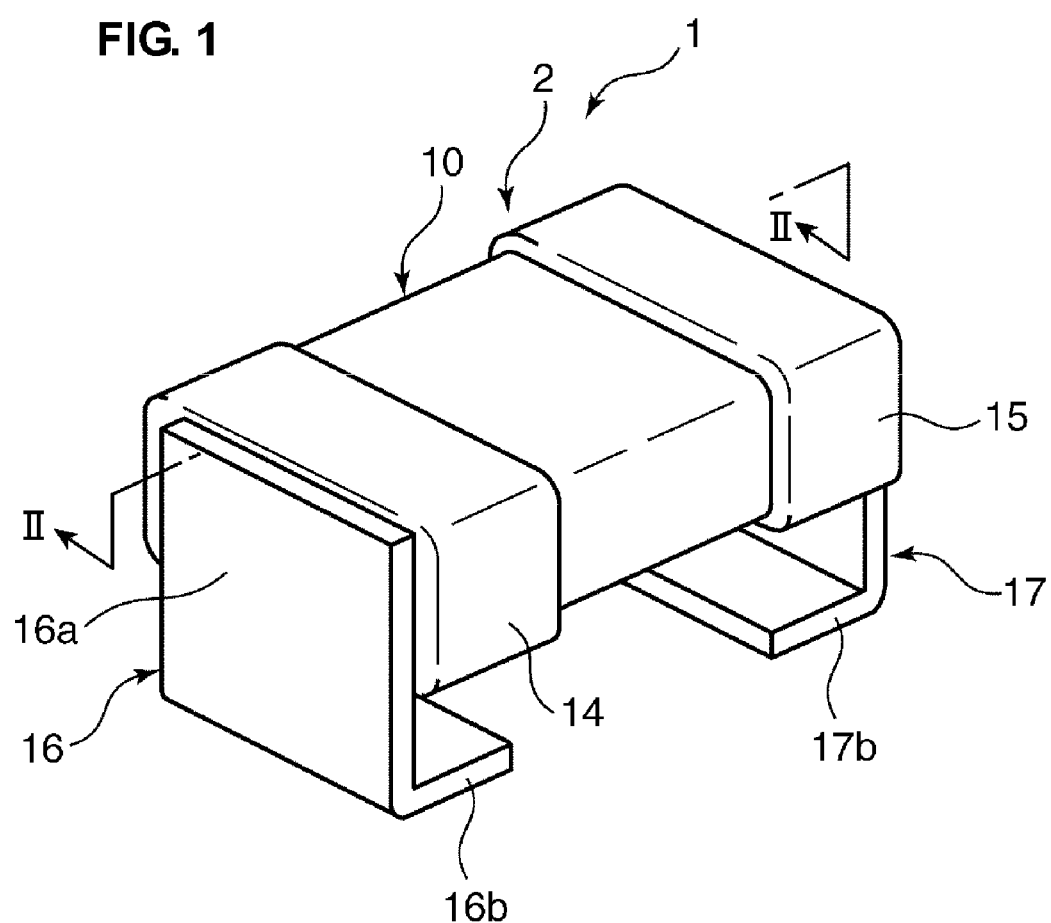
FIG. 1 is a perspective view of a ceramic electronic component according to a first preferred embodiment of the present invention.
Figure 2:
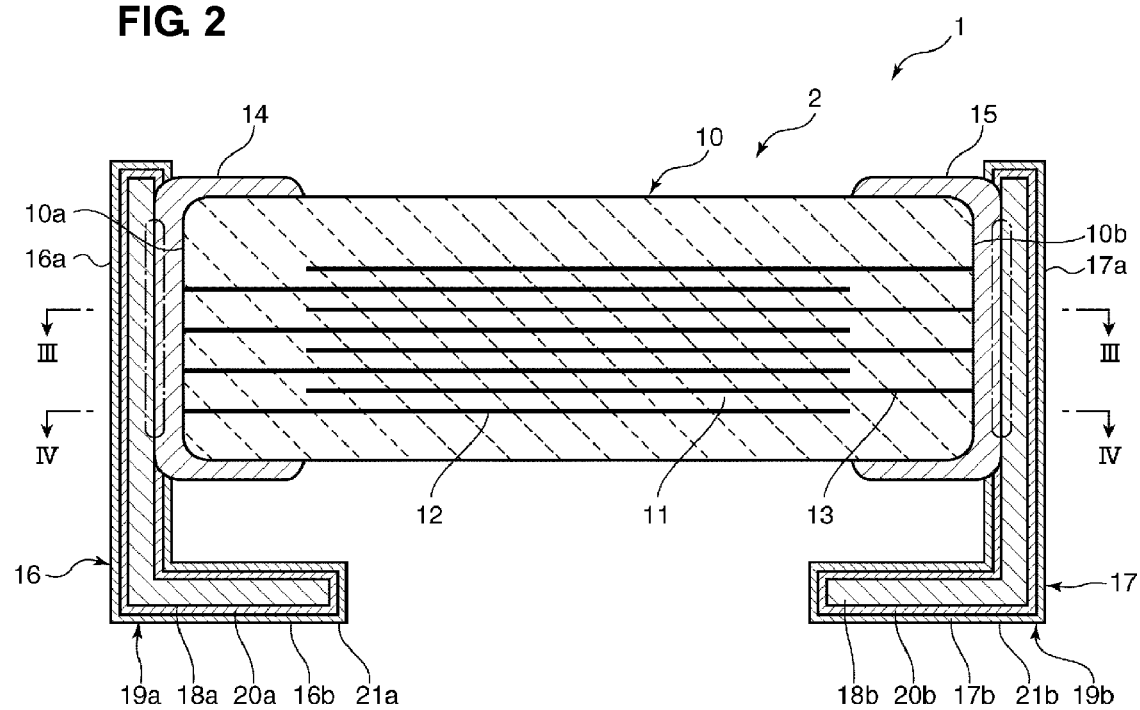
FIG. 2 is a view as viewed along direction of arrow II-II in FIG. 1.

As shown in FIGS. 1 and 2, a ceramic electronic component 1 has a ceramic element 2 and a pair of metal terminals 16 and 17. The ceramic element 2 has a ceramic element assembly 10 preferably having a substantially rectangular parallelepiped shape which has been R-chamfered, for example. As shown in FIG. 2, the ceramic element assembly 10 has a plurality of laminated ceramic layers 11, and a plurality of first internal electrodes 12 preferably having a substantially rectangular shape and a plurality of second internal electrodes 13 having a substantially rectangular shape disposed between the dielectric layers.

The ceramic layer 11 is formed using a suitable ceramic. For example, when the ceramic electronic component 1 is a capacitor, the ceramic layer 11 is formed using a dielectric ceramic, such as a $BaTiO_3$ ceramic. For example, when the ceramic electronic component 1 is a piezoelectric component, the ceramic electronic component 1 is formed using a piezoelectric ceramic, such as a PZT ceramic. For example, when the ceramic electronic component 1 is a thermistor, the ceramic electronic component 1 is formed using a semiconductor ceramic, such as a spinel ceramic, for example.

The plurality of first internal electrodes 12 and the plurality of second internal electrodes 13 are alternately laminated. Some of the plurality of the first internal electrodes 12 and some of the plurality of the second internal electrodes 13 are mutually interposed in the lamination direction of the first internal electrodes 12 and the second internal electrodes 13. The ceramic layer 11 is disposed between each of the first internal electrodes 12 and each of the second internal electrodes 13.

The material used for each of the first and second internal electrodes 12 and 13 is suitably selected according to desired properties for the ceramic electronic component 1, kind of the ceramic layer 11, etc. For example, each of the first and second internal electrodes 12 and 13 is formed of a metal, such as Cu, Ni, Ag, or Pd or an alloy, such as an Ag—Pd alloy, for example.

Figure 4:
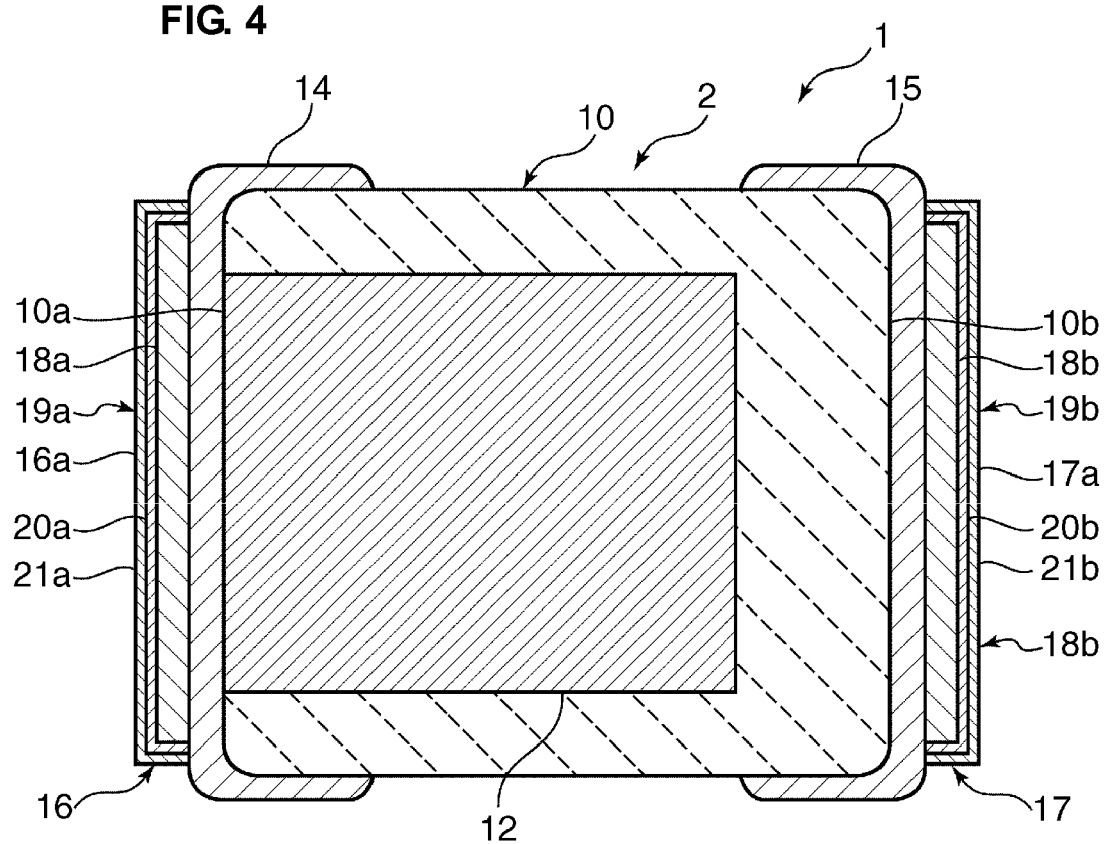
FIG. 4 is a view as viewed along direction of arrow IV-IV in FIG. 2.

As shown in FIGS. 2 and 4, the first internal electrode 12 extends from a first end surface 10a of the ceramic element assembly 10. On the first end surface 10a, a first external electrode 14 is defined. Specifically, the first external electrode 14 is arranged so as to cover the first end surface 10a. The first internal electrode 12 is electrically connected to the first external electrode 14.

Figure 3:
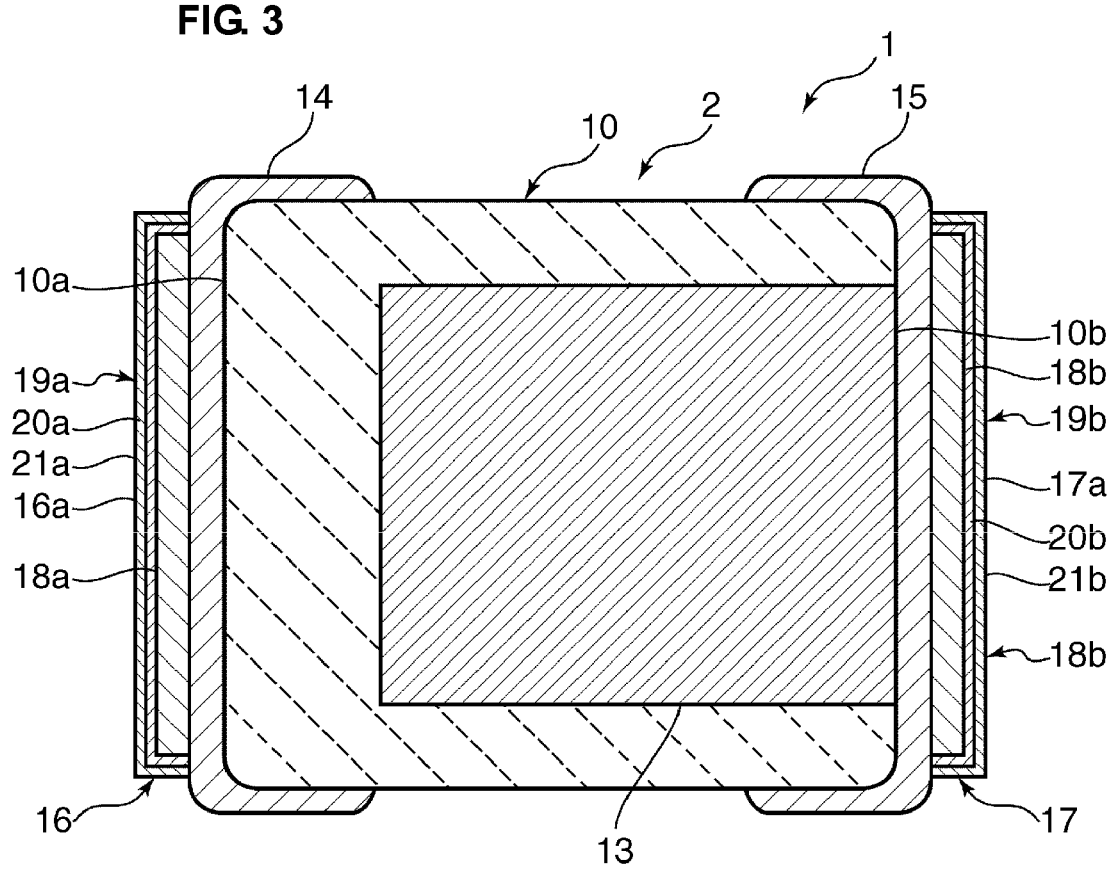
FIG. 3 is a view as viewed along direction of arrow III-III in FIG. 2.

As shown in FIGS. 2 and 3, the second internal electrode 13 extends from a second end surface 10b of the ceramic element assembly 10. On the second end surface 10b, a second external electrode 15 is defined. Specifically, the second external electrode 15 is arranged so as to cover the second end surface 10b. The second internal electrode 13 is electrically connected to the second external electrode 15.

In this preferred embodiment, each of the first and second external electrodes 14 and 15 preferably contains a sintered metal and glass. Specifically, each of the first and second external electrodes 14 and 15 preferably contains a metal such as Cu, Ni, Ag, or Pd, as a sintered metal, and glass, for example. In other words, each of the first and second external electrodes 14 and 15 is preferably obtained by sintering a mixture of a powder of a metal, such as Cu, Ni, Ag, or Pd, or an alloy (e.g., Ag—Pd alloy) containing at least one of the metals as a main component and glass powder, for example. Each of the first and second external electrodes 14 and 15 preferably do not have a plating film or the like arranged thereon. Therefore, a sintered metal is exposed at the surface of the first and second external electrodes 14 and 15.

Glass is preferably added to the first and second external electrodes 14 and 15 for the purpose of increasing the bonding properties of the first and second external electrodes 14 and 15 for the ceramic element assembly 10 or increasing the sealing properties of the first and second external electrodes 14 and 15. However, glass is not an essential ingredient, and each of the first and second external electrodes 14 and 15 may be formed of substantially only a sintered metal, for example.

As shown in FIGS. 1 and 2, a first metal terminal 16 is bonded to the first external electrode 14. The first metal terminal 16 preferably is arranged substantially into an "L" shape. The first metal terminal 16 preferably has a bonding portion 16a arranged to be bonded to the first external electrode 14 and a mounting portion 16b arranged to be mounted on a mounting substrate (not shown).

A second metal terminal 17 is bonded to the second external electrode 15. The second metal terminal 17 preferably is arranged substantially into an "L" shape. As shown in FIG. 2, the second metal terminal 17 preferably has a bonding portion 17a arranged to be bonded to the second external electrode 15 and a mounting portion 17b arranged to be mounted on a mounting substrate (not shown).

Each of the first and second metal terminals 16 and 17 preferably has terminal bodies 18a and 18b and plating films 19a and 19b. The plating films 19a and 19b are defined on the terminal bodies 18a and 18b, respectively. With the plating film 19a, the exposed portions of the terminal bodies 18a and 18b are covered.

The plating films 19a and 19b preferably have lower plating films 20a and 20b and upper plating films 21a and 21b, respectively. The lower plating films 20a and 20b are arranged on the terminal bodies 18a and 18b, respectively. The upper plating films 21a and 21b are arranged on the lower plating films 20a and 20b, respectively. Each of the lower plating films 20a and 20b and each of the upper plating films 21a and 21b may be formed of a plurality of plating films.

The thickness of the terminal bodies 18a and 18b is preferably about 0.1 mm to about 0.5 mm, for example. The thickness of the lower plating films 20a and 20b is preferably about 1.0 μm to about 5.0 μm, for example. The thickness of the upper plating films 21a and 21b is preferably about 1.0 μm to about 5.0 μm, for example.

According to this preferred embodiment, each of the terminal bodies 18a and 18b and each of the lower plating films 20a and 20b preferably contain Ni, Fe, Cu, Ag, Cr, or an alloy containing at least one of the metals as a main component, for example. Each of the terminal bodies 18a and 18b and each of the lower plating films 20a and 20b preferably contain Ni, Fe, Cr, or an alloy containing at least one of the metals as a main component, for example. Specifically, as base materials of the terminal bodies 18a and 18b, an Fe-42Ni alloy or an Fe-18Cr alloy is used, for example.

The heat resistance of the first and second external electrodes 14 and 15 can be increased by forming each of the terminal bodies 18a and 18b and each of the lower plating films 20a and 20b using Ni, Fe, or Cr having a high melting point or an alloy containing at least one of the metals as a main component.

The upper plating films 21a and 21b contain Sn, Ag, Au, or an alloy containing at least one of the metals as a main component. Preferably, the upper plating films 21a and 21b contain Sn or an alloy containing Sn as a main component.

By the forming of the upper plating films 21a and 21b using Sn or an alloy containing Sn as a main component, the diffusion of metal from the first and second metal terminals 16 and 17 into the first and second external electrodes 14 and 15 can be accelerated.

Figure 5:
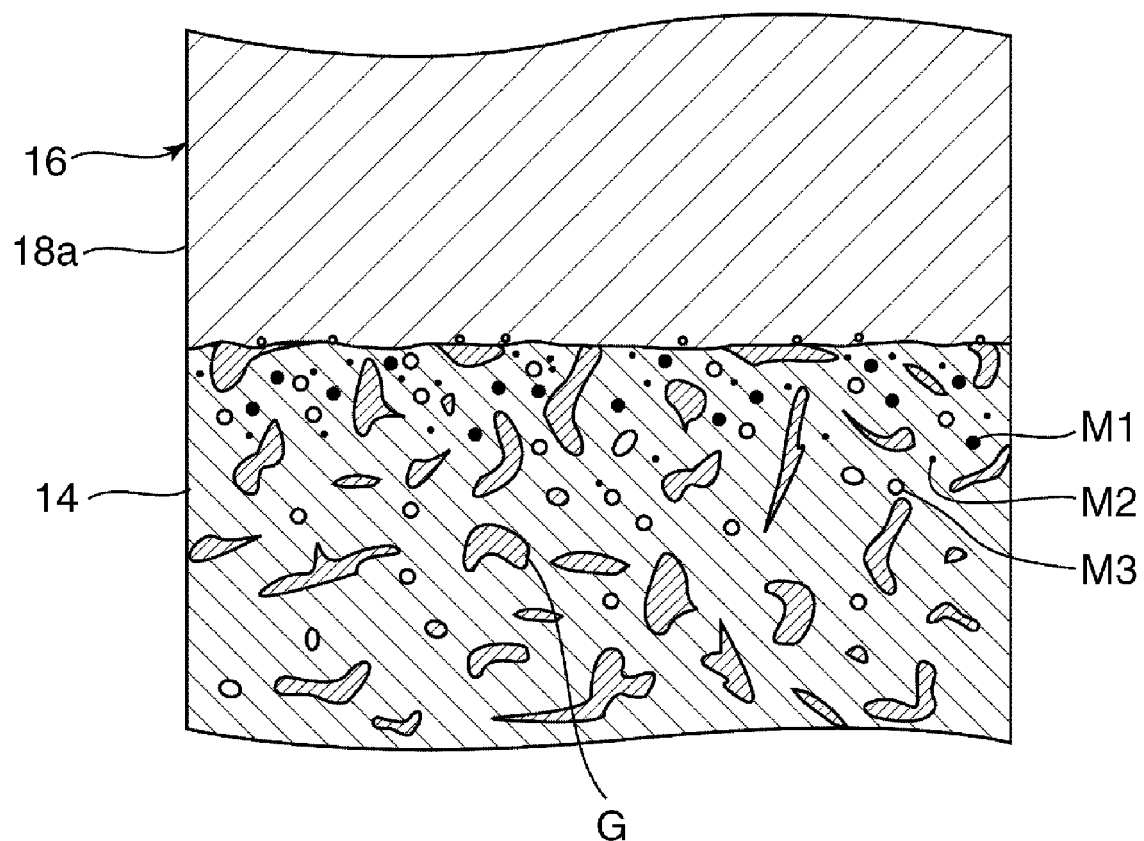
FIG. 5 is a schematic cross section showing a bonding state of a first external electrode with a first metal terminal according to a preferred embodiment of the present invention.

FIG. 5 is a schematic cross section showing a bonding state of the first external electrode 14 with the first metal terminal 16. As shown in FIG. 5, in this preferred embodiment, the first external electrode 14 and the first metal terminal 16 are directly diffusion-bonded when metals M1 to M3 in the first metal terminal 16 are diffused, on the atomic level, into the first external electrode 14. Similarly, the second external electrode 15 and the second metal terminal 17 are directly diffusion-bonded when metals M1 to M3 in the second metal terminal 17 are diffused, on the atomic level, into the second external electrode 15. Specifically, the first and second external electrodes 14 and 15 and the first and second metal terminals 16 and 17 are directly diffusion-bonded, respectively, when both metals of the terminal bodies 18a and 18b and metals of the plating films 19a and 19b are diffused into the first and second external electrodes 14 and 15.

FIG. 5 is a schematic view. It should be noted that the kinds of metals diffused into the first external electrode 14 are not limited to the three kinds. Reference character "G" in FIG. 5 represents glass.

Next, processes for manufacturing the ceramic electronic component 1 will be described in detail.

First, a ceramic green sheet, a conductive paste used for internal electrode formation to form the first and second internal electrodes 12 and 13, and a conductive paste used for external electrode formation to form the first and second external electrodes 14 and 15 are prepared. Known organic binders and organic solvents can be used as an organic binder or an organic solvent contained in the ceramic green sheet, the conductive paste for internal electrode formation, and the conductive paste for external electrode formation.

Next, an internal electrode pattern is formed by printing the conductive paste used for internal electrode formation on the ceramic green sheet. The conductive paste used for internal electrode formation can be printed by known methods, such as screen printing, for example.

Next, a given number of ceramic green sheets on which the internal electrode pattern has been formed are laminated, and ceramic green sheets on which the internal electrode pattern is not formed are laminated above and below the ceramic green sheets, whereby a mother laminate is formed. The mother laminate may be pressed by isostatic pressing, for example, as required.

Next, the mother laminate is cut into a predetermined shape and dimensions to thereby obtain a raw ceramic laminate. The obtained raw ceramic laminate is fired. The firing temperature of the raw ceramic laminate is suitably determined according to the kind of the ceramic, the conductive paste for internal electrode formation, etc. Specifically, the firing temperature of the raw ceramic laminate is adjusted to be about 900° C. to about 1300° C., for example.

Next, the first and second external electrodes 14 and 15 are formed by applying the conductive paste used for external electrode formation to both end surfaces of the fired ceramic laminate, and then firing. The firing temperature of the conductive paste used for external electrode formation is suitably determined according to the kind of the conductive paste for external electrode formation. Specifically, the firing temperature of the conductive paste used for external electrode formation is adjusted to be about 700° C. to about 900° C., for example. The firing of the conductive paste used for external electrode formation and the firing of the raw ceramic laminate are performed in air, in an $N_2$ atmosphere, or in an atmosphere of steam and $N_2$, for example.

Figure 6:
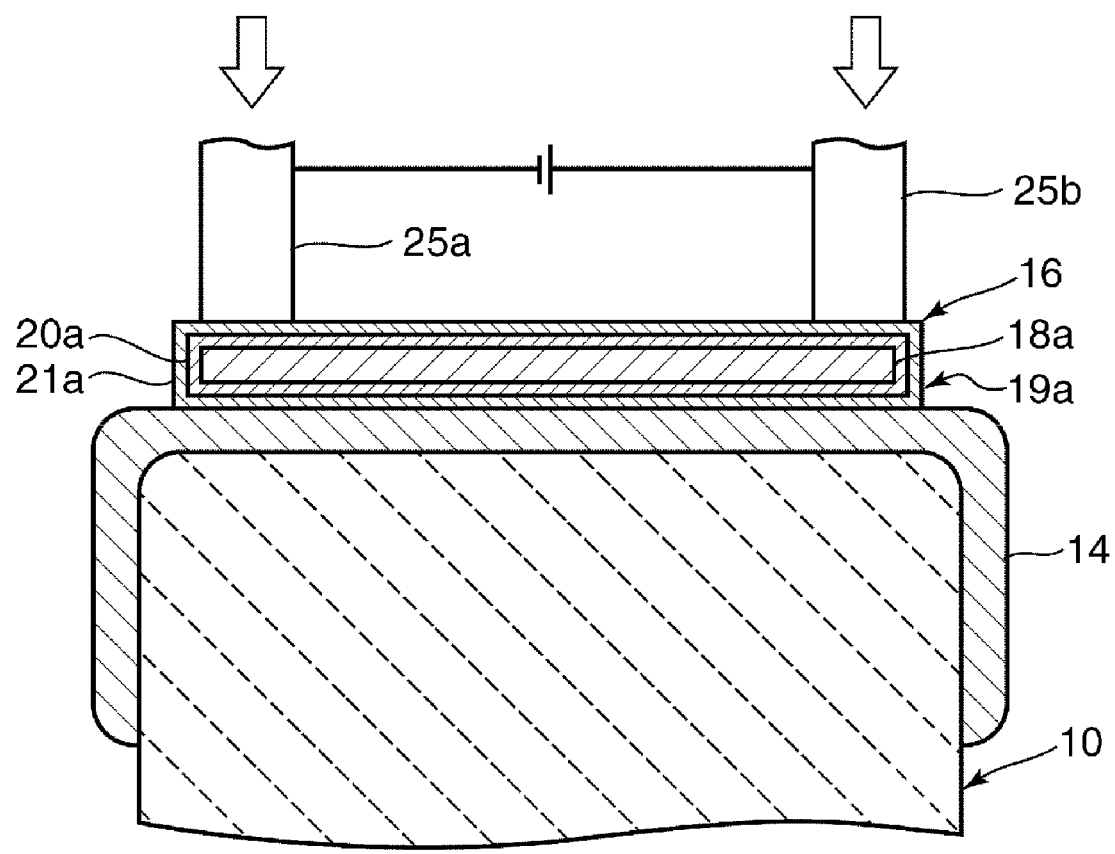
FIG. 6 is a cross section showing a diffusion-bonding process of the first external electrode with the first metal terminal according to a first preferred embodiment of the present invention.

Next, the first and second metal terminals 16 and 17 are diffusion-bonded to the first and second external electrodes 14 and 15, respectively. Specifically, as shown in FIG. 6, a current is preferably applied between a pair of bonding terminals 25a and 25b (for example, welding rods) in a state where the pair of bonding terminals 25a and 25b are pressed against the first metal terminal 16 while the first external electrode 14 and the first metal terminal 16 are in contact with each other. Thus, the tips of the bonding terminals 25a and 25b, the first metal terminal 16, and the first external electrode 14 are heated. Here, in this preferred embodiment, the first external electrode 14 contains a sintered metal and has gaps between metal particles. The gaps between metal particles are preferably filled with glass. Thus, when the tips of the bonding terminals 25a and 25b, the first metal terminal 16, and the first external electrode 14 are heated, diffusion of the metal in the first metal terminal 16 into the metal particles of the first external electrode 14 is accelerated. As a result, the first metal terminal 16 and the first external electrode 14 are diffusion-bonded to each other.

Similarly, a current is applied between a pair of bonding terminals 25a and 25b in a state where the pair of bonding terminals 25a and 25b are pressed against the second metal terminal 17 while the second external electrode 15 and the second metal terminal 17 are in contact with each other. Thus, the tips of the bonding terminals 25a and 25b, the second metal terminal 17, and the second external electrode 15 are heated, and then the metal in the second metal terminal 17 is diffused into the second external electrode 15. As a result, the second external electrode 15 and the second metal terminal 17 are diffusion-bonded to each other.

There is no limitation regarding the material of the bonding terminals 25a and 25b. The bonding terminals 25a and 25b may be formed of tungsten, for example. The bonding conditions of the first and second metal terminals 16 and 17 are suitably determined according to the materials or the like of the first and second metal terminals 16 and 17 and the first and second external electrodes 14 and 15. In this preferred embodiment, the diffusion-bonding of the first and second metal terminals 16 and 17 is generally performed at a maximum current of about 200A to about 800A, at a welding time of about 300 msec to about 1000 msec, at a welding pressure of about 30 N to about 50 N, and at a maximum temperature near the bonding portion of about 700° C. to about 900° C.

As described above, in this preferred embodiment, the first and second metal terminals 16 and 17 are preferably directly diffusion-bonded to the first and second external electrodes 14 and 15, respectively. Therefore, a solder and a bonding interface with a solder do not exist in the bonding portion, unlike a case where solder bonding is performed using a solder as disclosed in Japanese Unexamined Patent Application Publication No. 2003-303736. Thus, a ceramic electronic component having high reliability which is free from deterioration of the solder itself or deterioration of the bonding portion due to the generation of an intermetallic compound at the bonding interface under a high temperature environment or a thermal-cycle environment can be provided.

In this preferred embodiment, a solder does not need to be separately prepared. Therefore, the material cost of the ceramic electronic component 1 can be reduced while the manufacturing processes of the ceramic electronic component 1 can be simplified.

When the first and second metal terminals 16 and 17 and the first and second external electrodes 14 and 15 are directly diffusion-bonded to each other, respectively, as in this preferred embodiment, the heat resistance and thermal shock resistance of the ceramic electronic component 1 can increase, unlike the case where a high temperature solder containing no lead is used as disclosed in Japanese Unexamined Patent Application Publication No. 2003-303736.

In this preferred embodiment, the plating films 19a and 19b are formed on the terminal bodies 18a and 18b. Therefore, the diffusion of metal from the first and second metal terminals 16 and 17 to the first and second external electrodes 14 and 15 can be accelerated. Moreover, when the plating films 19a and 19b are formed on the terminal bodies 18a and 18b, the mounting properties of the ceramic electronic component 1 for the mounting board can be improved.

In this preferred embodiment, a description is given about a case where the first and second internal electrodes 12 and 13 are arranged inside the ceramic element assembly 10. In the present invention, the first and second internal electrodes 12 and 13 are not essential constituent requirements. The ceramic element assembly 10 may contain a pair of ceramics in which no electrodes are formed.

Hereinafter, further preferred embodiments and modifications of preferred examples of the present invention will be described. In the following description, members having functions substantially common with those of the first preferred embodiment are denoted with the same reference numerals, and thus descriptions thereof are omitted.

FIRST MODIFIED EXAMPLE

The first preferred embodiment describes an example where a pair of bonding terminals 25a and 25b are used for the diffusion-bonding of the first and second external electrodes 14 and 15 with the first and second metal terminals 16 and 17, respectively, as shown in FIG. 6. The bonding terminals used for the diffusion-bonding of the first and second external electrodes 14 and 15 with the first and second metal terminals 16 and 17, respectively, are not limited to the bonding terminals 25a and 25b.

Figure 7:
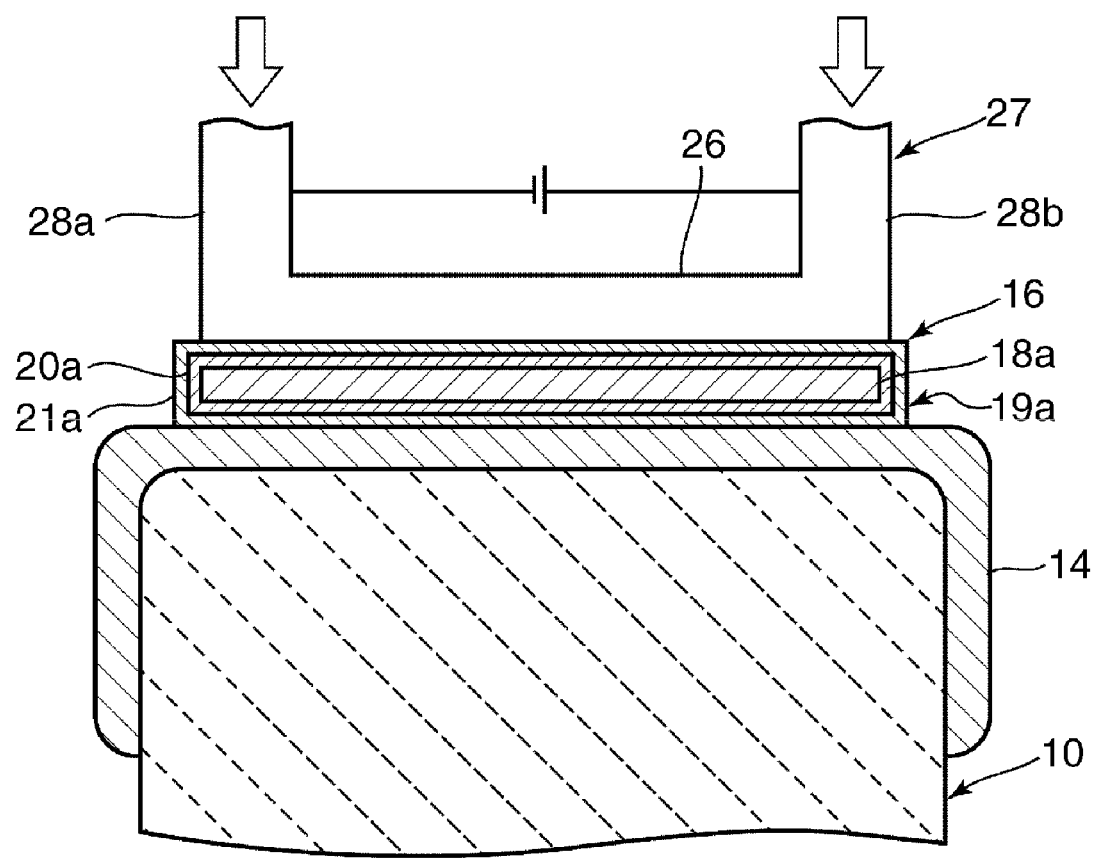
FIG. 7 is a cross section showing a diffusion-bonding process of the first external electrode with the first metal terminal according to a first modified example of a preferred embodiment of the present invention.

For example, as shown in FIG. 7, the first and second external electrodes 14 and 15 and the first and second metal terminals 16 and 17 may also be diffusion-bonded using a bonding terminal 27 having a resistive portion 26. Specifically, the bonding terminal 27 has a first terminal portion 28a and a second terminal portion 28b. The tip of the first terminal portion 28a and the tip of the second terminal portion 28b are connected by the resistive portion 26. Therefore, when a current is applied between the first terminal portion 28a and the second terminal portion 28b, the resistive portion 26 functions as a resistive element to generate heat.

When the resistive portion 26 is brought into contact with the first metal terminal 16, and a current is applied between the first and second terminal portions 28a and 28b, the first metal terminal 16 and the first external electrode 14 can be heated with the resistive portion 26 for diffusion-bonding.

The junction terminal 27 can be formed of tungsten, for example, similarly as in the bonding terminals 25a and 25b of the first preferred embodiment.

In this modified example, the diffusion-bonding of the first and second external electrodes 14 and 15 with the first and second metal terminals 16 and 17 is generally performed at a maximum current of about 1200 A to about 2000 A, at a welding time of about 500 msec to 1500 msec, at a welding pressure of about 60 N to about 100 N, and at a maximum temperature near the bonding portion of about 700° C. to about 900° C., for example.

Second Preferred Embodiment

Figure 8:
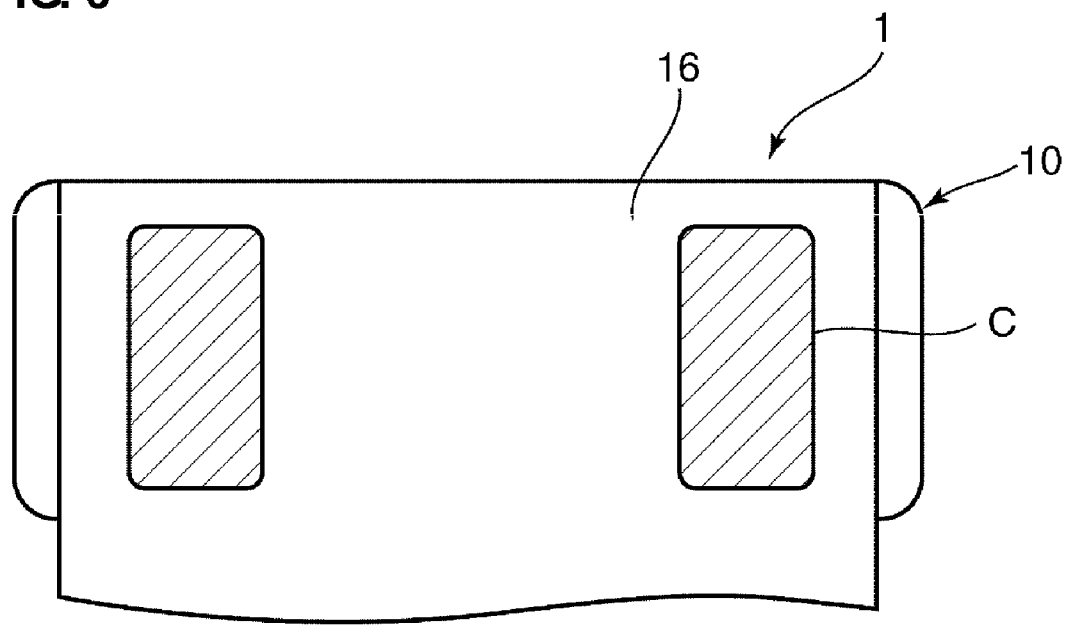
FIG. 8 is a side view of a ceramic electronic component according to a second preferred embodiment of the present invention.

As shown in FIG. 8, the first metal terminal 16 and the first external electrode 14 may be bonded to each other at a plurality of bonding portions C. Similarly, the second metal terminal 17 and the second external electrode 15 may be bonded to each other at a plurality of bonding portions C. Specifically, in this preferred embodiment, the first and second metal terminals 16 and 17 and the first and second external electrodes 14 and 15 are bonded to each other, respectively, at two bonding portions C.

Figure 9:
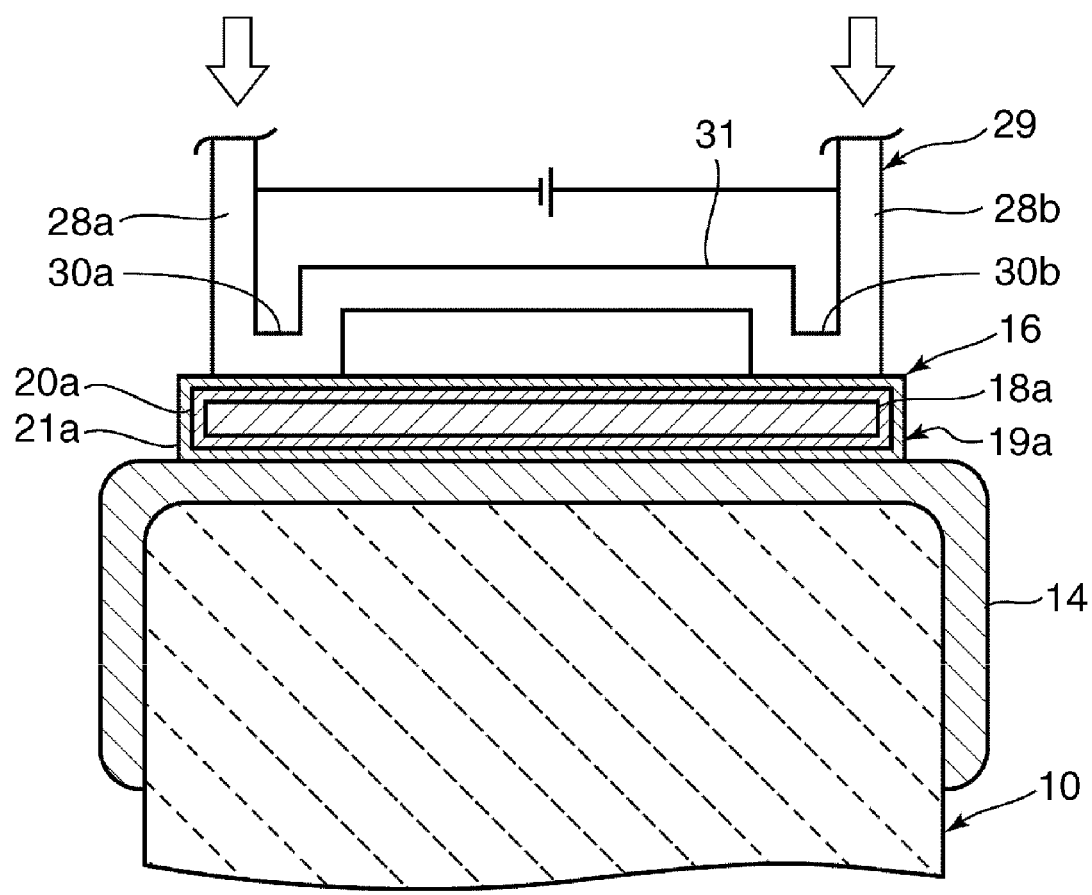
FIG. 9 is a cross section showing a diffusion-bonding process of the first external electrode with the first metal terminal according to a second preferred embodiment of the present invention.

When the first metal terminal 16 and the first external electrode 14 are bonded to each other at two bonding portions C, the first metal terminal 16 and the first external electrode 14 can be bonded to each other using a bonding terminal 29 shown in FIG. 9. The bonding terminal 29 has the first and second terminal portions 28a and 28b, first and second resistive portions 30a and 30b, and a bonding portion 31. When the first metal terminal 16 and the first external electrode 14 are bonded to each other, the first and second resistive portions 30a and 30b are pressed against the first metal terminal 16. When a current is applied between the first and second terminal portions 28a and 28b under the state, the resistive portions 30a and 30b generate heat. As a result, in the bonding portion C, the first metal terminal 16 and the first external electrode 14 are heated for diffusion-bonding.

As in this preferred embodiment, by providing the plurality of the bonding portions C of the first and second metal terminals 16 and 17 with the first and second external electrodes 14 and 15, respectively, a stress which generates in the ceramic element assembly 10 or the like when the first and second metal terminals 16 and 17 and the first and second external electrodes 14 and 15 are bonded to each other, respectively, or during cooling after bonding can be dissipated. Therefore, the development of cracks in the ceramic element assembly 10 or the like can be effectively prevented.

Figure 10:
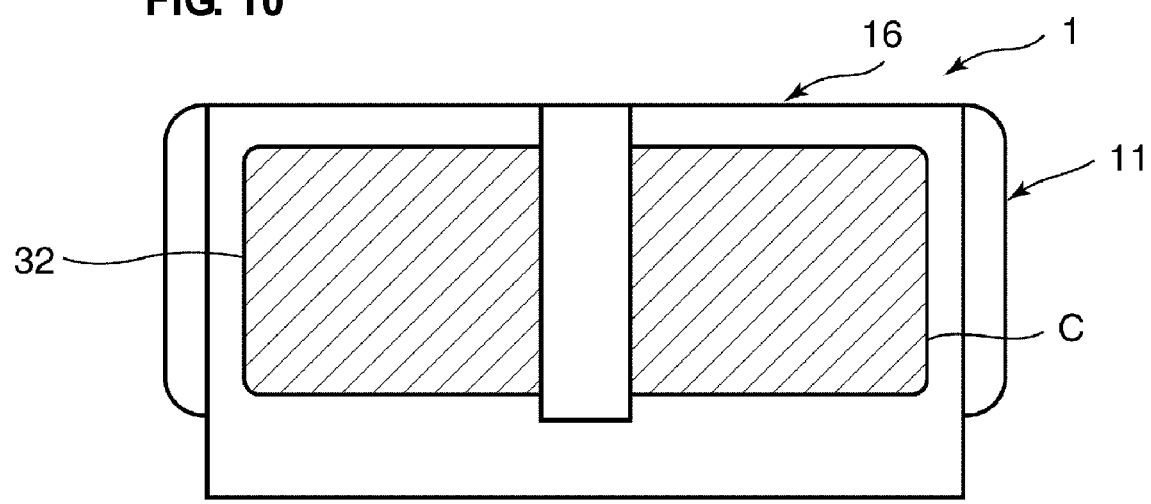
FIG. 10 is a side view of a ceramic electronic component according to a third preferred embodiment of the present invention.
Figure 12:
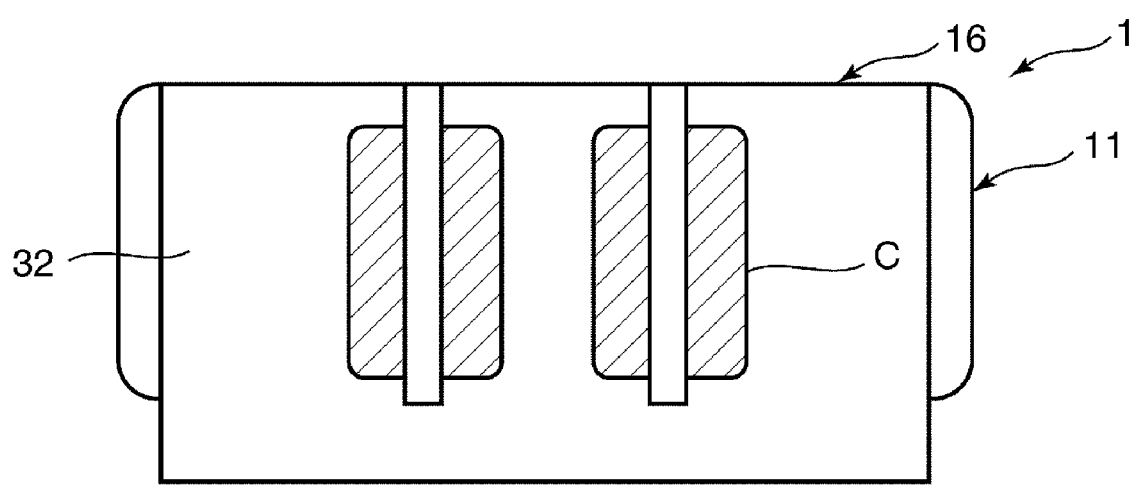
FIG. 12 is a side view of a ceramic electronic component according to a fourth preferred embodiment of the present invention.

The hatched portions of FIGS. 8, 10, and 12 represent a bonding portion of the first and second metal terminals 16 and 17 with the first and second external electrodes 14 and 15, respectively, and indentation on the front surface of the metal terminal, and do not represent the cross section of the members.

Third and Fourth Preferred Embodiments

FIG. 10 is a side view of the ceramic electronic component 1 according to a third preferred embodiment. As shown in FIG. 10, the first metal terminal 16 has a plurality of filament-shaped terminal portions 32 disposed in parallel or substantially in parallel to each other. Although not shown, the second metal terminal 17 also has two filament-shaped terminal portions 32 disposed in parallel or substantially in parallel to each other in this preferred embodiment similarly as the first metal terminal 16. The tip of each of the terminal portion 32 of the first and second metal terminals 16 and 17 is diffusion-bonded to the first and second external electrodes 14 and 15.

Thus, by providing the plurality of the terminal portions 32 to the first and second metal terminals 16 and 17, a stress can be dissipated which generates in the ceramic element assembly 10 or the like when the first and second metal terminals 16 and 17 and the first and second external electrodes 14 and 15 are bonded to each other, respectively, or during cooling after bonding. Therefore, the development of cracks in the ceramic element assembly 10 or the like can be effectively minimized.

Figure 11:
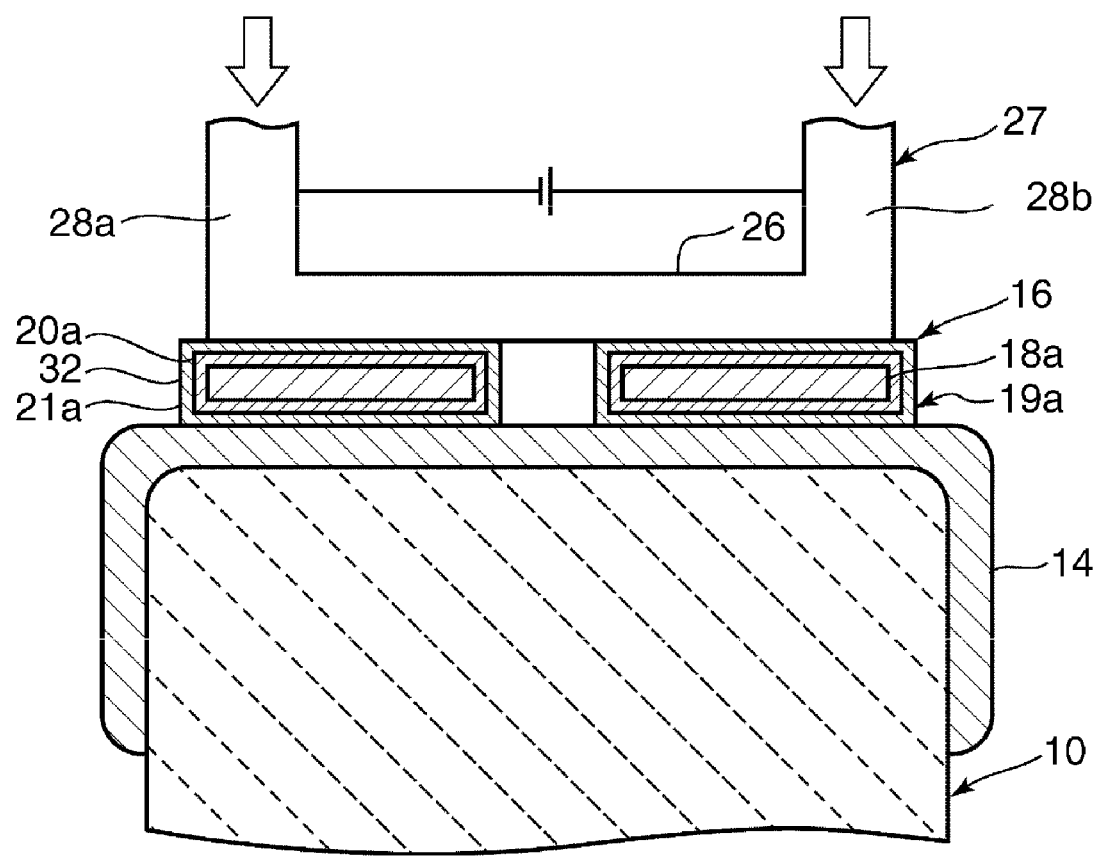
FIG. 11 is a cross section showing a diffusion-bonding process of the first external electrode with the first metal terminal according to a third preferred embodiment of the present invention.

There is no limitation regarding the diffusion-bonding method of the first and second metal terminals 16 and 17 with the first and second external electrodes 14 and 15, respectively, in the third preferred embodiment. For example, as shown in FIG. 11, the diffusion-bonding of the first and second metal terminals 16 and 17 with the first and second external electrodes 14 and 15, respectively, in the third preferred embodiment can be achieved by the bonding terminal 27.

The number of the terminal portions 32 of the first and second metal terminals 16 and 17 is not limited to two. For example, as shown in FIG. 12, three terminal portions 32 may be provided. In an example shown in FIG. 12, since four bonding portions C are provided, a stress generated in the ceramic element assembly 10 or the like during bonding or cooling can be more effectively dissipated. Therefore, the development of cracks in the ceramic element assembly 10 or the like can be more effectively minimized.

Figure 13:
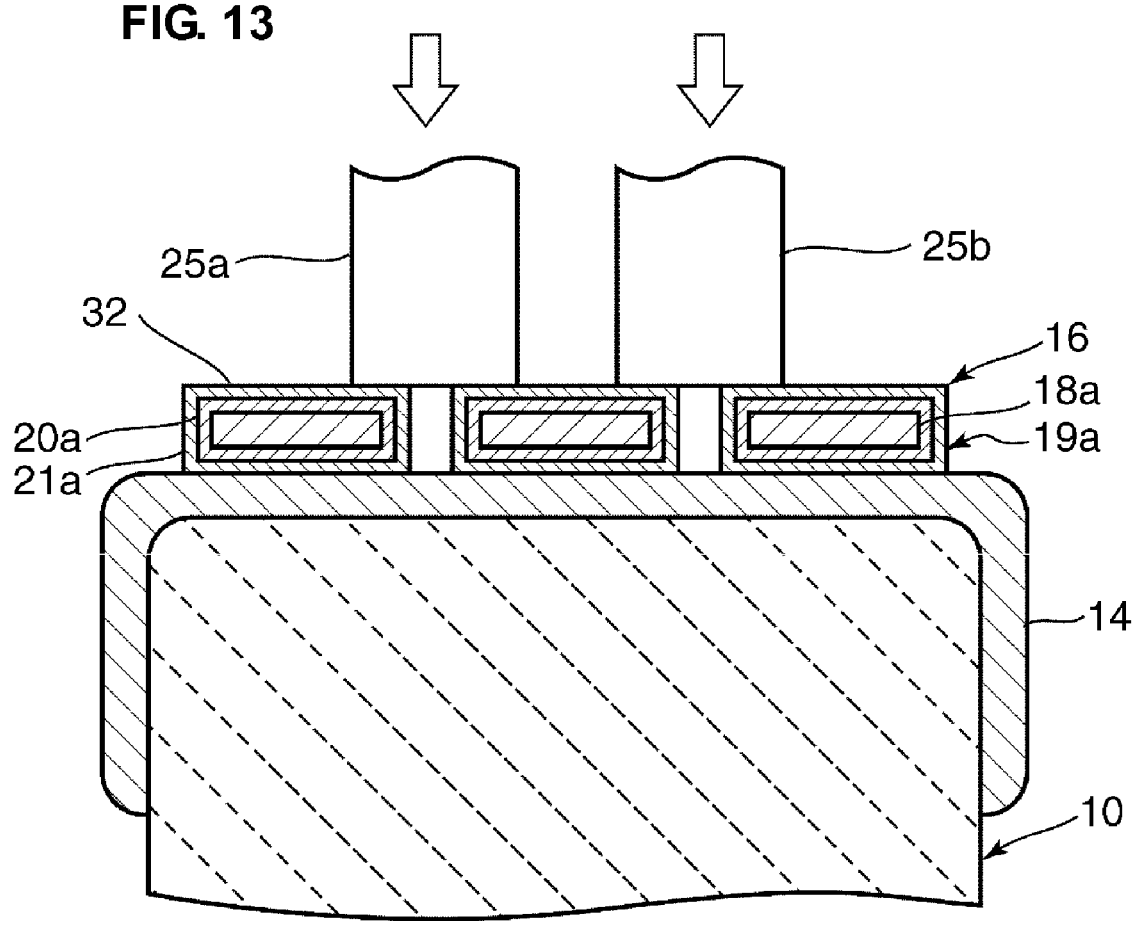
FIG. 13 is a cross section showing a diffusion-bonding process of the first external electrode with the first metal terminal according to a fourth preferred embodiment of the present invention.

There is no limitation regarding the diffusion-bonding method of the first and second metal terminals 16 and 17 with the first and second external electrodes 14 and 15, respectively, in the fourth preferred embodiment. For example, as shown in FIG. 13, the diffusion-bonding of the first metal terminal 16 and the first external electrode 14 in the fourth preferred embodiment can be achieved using the pair of the bonding terminals 25a and 25b. In this case, the diffusion-bonding of the terminal portion 32 located outside and the first external electrode 14 can be achieved by heat generation of the second bonding terminals 25a and 25b.

SECOND MODIFIED EXAMPLE

Figure 14:
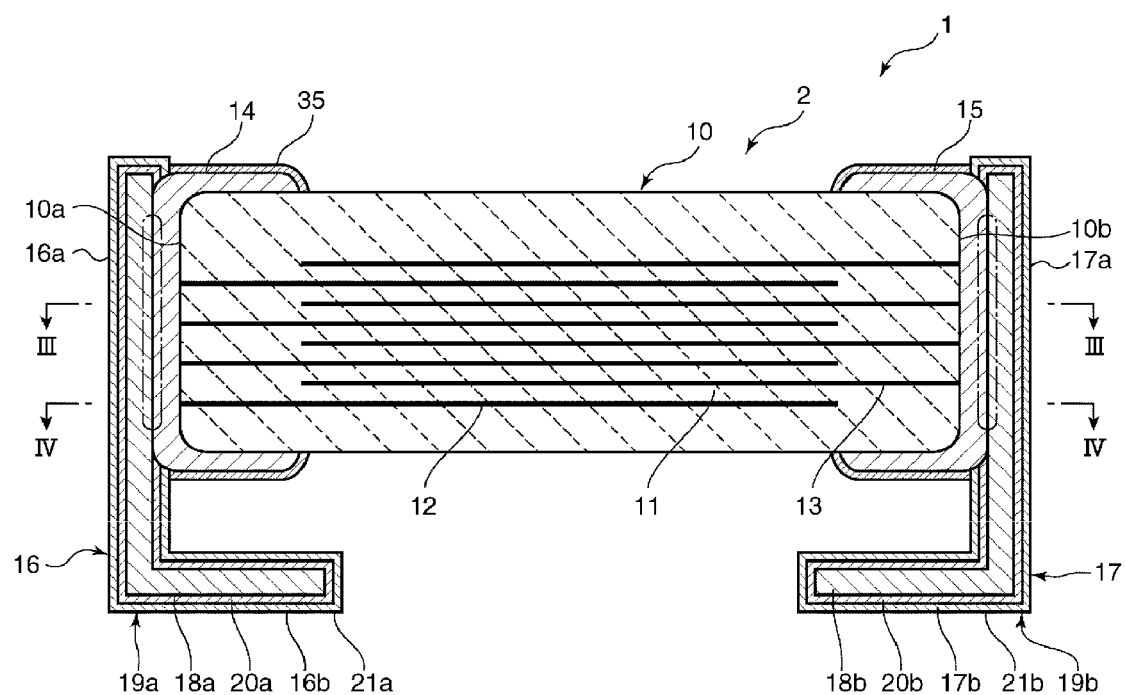
FIG. 14 is a cross section of a ceramic electronic component according to a second modified example of a preferred embodiment of the present invention.

FIG. 14 is a cross section showing a ceramic electronic component in a second modified example of a preferred embodiment of the present invention. As shown in FIG. 14, an anti-corrosion film 35 that covers an exposed portion of the outer surface the first and second external electrodes 14 and 15 may be provided. Thus, oxidation of the first and second metal terminals 16 and 17 can be minimized.

The type of anti-corrosion film 35 is not limited. For example, the anti-corrosion film 35 may be an imidazole or benzotriazole organic coating or a plating film, such as an Sn plating film.

THIRD MODIFIED EXAMPLE

There is no limitation regarding a heat source in the diffusion-bonding of the metal terminals 16 and 17 and the external electrodes 14 and 15, respectively. For example, a laser beam may be emitted from the metal terminal side in a state where the metal terminals 16 and 17 are in contact with the external electrodes 14 and 15, respectively. In such a case, the output of the laser is adjusted so that the external electrodes 14 and 15 do not melt.

EXPERIMENTAL EXAMPLE

A paste in which Cu powder having an average particle diameter of about 1.8 μm and glass powder having an average particle diameter of about 2 μm were mixed with a weight ratio of about 9:1 was applied to both ends of the ceramic element assembly 10, and the resultant was fired at about 88° C. for about 1 hour, thereby forming the first and second external electrodes 14 and 15.

An approximately 1.0 μm thick Ni plating film and an approximately 2.0 μm thick Sn plating film were successively formed on an approximately 0.1 mm thick metal plate formed of an Fe-42Ni alloy, thereby manufacturing the first and second metal terminals 16 and 17 shown in FIG. 10.

Next, the first external electrode 14 and the first metal terminal 16 and the second external electrode 15 and the second metal terminal 17 were brought into contact with each other, and were diffusion-bonded on the conditions of a maximum current of about 280 A and a welding time of about 600 msec in a state where they are pressed against each other at a welding pressure of about 40 N.

As a comparative example, the first external electrode 14 and the first metal terminal 16 and the second external electrode 15 and the second metal terminal 17 were bonded to each other using an Sn-0.7Cu solder.

Each of the diffusion-bonded ceramic electronic component and the soldered ceramic electronic component was subjected to a reflow heat resistance test, a high temperature load test, and a thermal shock cycle test.

The reflow heat resistance test was performed by passing the ceramic electronic components through an about 230° C. reflow furnace a plurality of times, and visually observing floating of the ceramic element assembly 10.

Floating of the ceramic element assembly 10 was not observed in the diffusion-bonded ceramic electronic component even when it was made to pass through the reflow furnace 10 times. In contrast, floating of the ceramic element assembly 10 was observed in the soldered ceramic electronic component after it was made to pass through the reflow furnace 6 times. The results show that a higher heat resistance can be obtained in the case where the first and second metal terminals 16 and 17 and the first and second external electrodes 14 and 15 were diffusion-bonded, respectively, compared with the case where they were soldered.

A high temperature load test measured the bond strength between the first and second external electrodes 14 and 15 and the first and second metal terminals 16 and 17, respectively after the ceramic electronic component was allowed to stand in an about 175° C. atmosphere for about 1000 hours. Moreover, the diffusion-bonded ceramic electronic component and the soldered ceramic electronic component before the high temperature load test were measured for the bond strength between the first and second external electrodes 14 and 15 and the first and second metal terminals 16 and 17, respectively.

The bond strength was measured as follows: the center of the ceramic element assembly was pressed in the direction in parallel to the first and second metal terminals and in parallel to the substrate in a state where the first and second metal terminals of the ceramic electronic component are fixed on the substrate, a load when the first and second metal terminals were disconnected was measured using a push-pull gauge (tradename: RX-100, manufactured by Aikoh Engineering Co., Ltd.), and the measured load was used as the bond strength.

In the soldered ceramic electronic component, the bond strength decreased by as high as about 60% by the high temperature load test, and in contrast, in the diffusion-bonded ceramic electronic component, the bond strength decreased by as low as about 10% by the high temperature load test. The results also show that a higher heat resistance can be obtained in the case where the first and second metal terminals 16 and 17 and the first and second external electrodes 14 and 15 were diffusion-bonded, respectively, compared with the case where they were soldered.

A thermal shock cycle test measured the bond strength between the first and second external electrodes 14 and 15 and the first and second metal terminals 16 and 17, respectively, by the above-described procedure after a cycle in which the ceramic electronic component was allowed to stand at a temperature of about 55° C. for about 30 minutes, and then at a temperature of about 125° C. for about 30 minutes was repeated about 3000 times. Moreover, the diffusion-bonded ceramic electronic component and the soldered ceramic electronic component before the thermal shock cycle test were measured for the bond strength between the first and second external electrodes 14 and 15 and the first and second metal terminals 16 and 17, respectively, by the above-described procedure.

In the soldered ceramic electronic component, the bond strength decreased as high as about 80% by the thermal shock cycle test, and in contrast, in the diffusion-bonded ceramic electronic component, the reduction in bond strength by the thermal shock cycle test was not observed. The results also show that a higher thermal shock resistance can be obtained in the case where the first and second metal terminals 16 and 17 and the first and second external electrodes 14 and 15 were diffusion-bonded, respectively, compared with the case where they were soldered.

Figure 15:
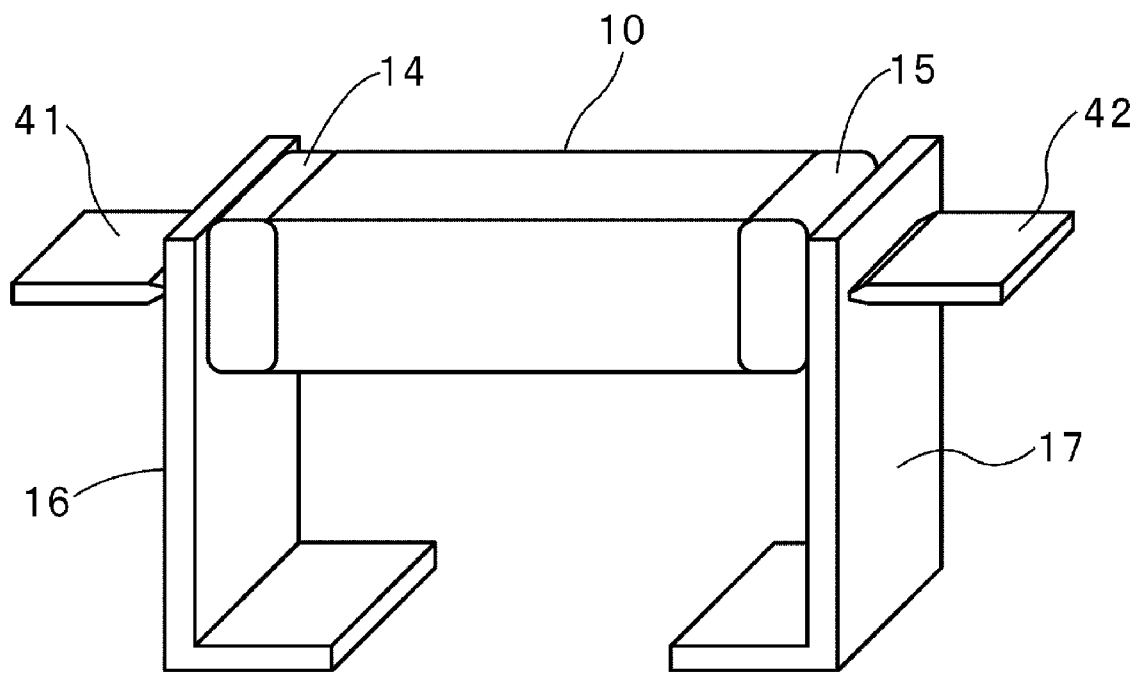
FIG. 15 is a schematic perspective view showing a diffusion-bonding process according to a preferred embodiment of the present invention.

As described above, according to the method for manufacturing the ceramic electronic component according to various preferred embodiments of the present invention, the external electrodes and the metal terminals are diffusion-bonded by heating in a state where the external electrodes and the metal terminals are brought into contact with each other. In this case, it is preferable to bring a terminal for diffusion-bonding into contact with the metal terminal, and apply a current a plurality of times. This will be described with reference to FIGS. 15 to 21. As shown in FIG. 15, the first and second metal terminals 16 and 17 are brought into contact with the external electrodes 14 and 15 of the ceramic element 2 described above, respectively, and terminals arranged to provide diffusion-bonding 41 and 42 are brought into contact with the metal terminals 16 and 17 from the outer surface, followed by heating. Thus, the metal terminals 16 and 17 are diffusion-bonded to the external electrodes 14 and 15, respectively. FIG. 15 schematically shows the terminals arranged to provide diffusion-bonding 41 and 42, and suitable terminals according to a heating system are used.

Figure 16:
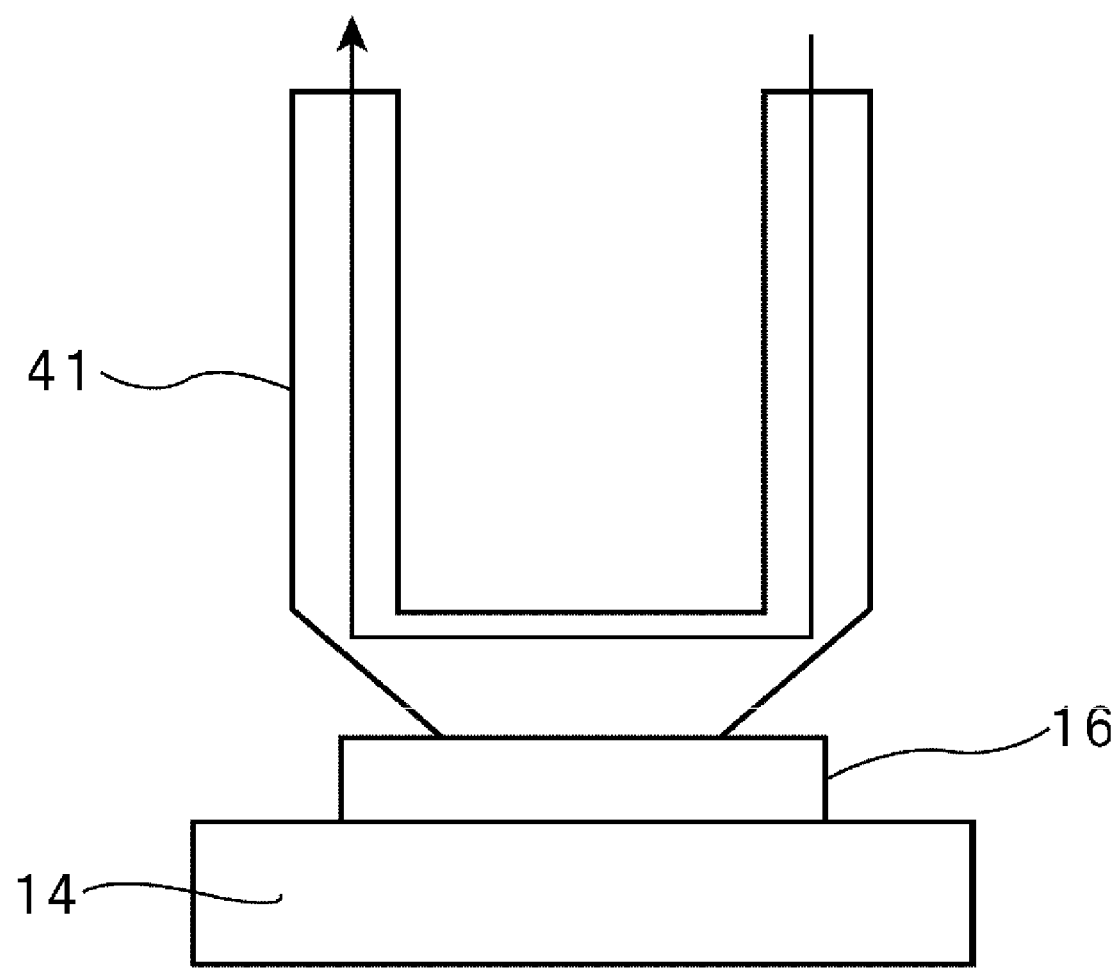
FIG. 16 is a schematic front view showing a diffusion-bonding method by a pulse heat system according to a preferred embodiment of the present invention.

For example, as shown in FIG. 16, the terminal arranged to provide diffusion-bonding 41 for heating by a pulse heat system may be brought into contact with the outer surface of the metal terminal 16 in a portion where the metal terminal 16 is brought into contact with the external electrode 14. In this case, a pulse current is applied to the terminal for diffusion-bonding 41 as indicated by the arrow of FIG. 16 to heat the metal terminal 16.

Figure 17:
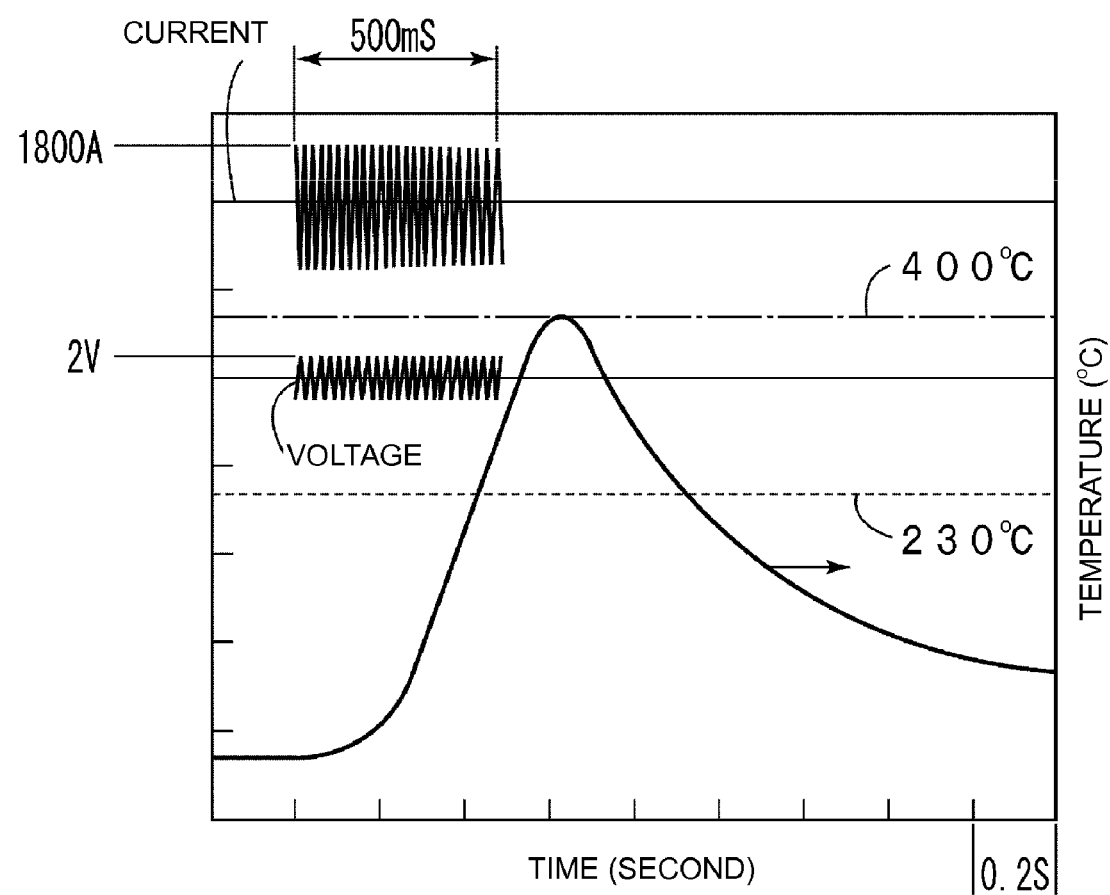
FIG. 17 is a view showing temperature changes of the metal terminal when a current is applied 1 time upon diffusion-bonding by a pulse heat system in a modified example of the manufacturing method according to a preferred embodiment of the present invention.

In this case, when a pulse current is applied for heating, the metal terminal 16 and the external electrode 14 are heated and further the ceramic element assembly 10 is heated. FIG. 17 is a view showing a relationship between a period of time while a pulse current is being applied and the temperature of the metal terminal 16. One division of the abscissa of FIG. 17 is about 0.2 second, for example. It is revealed that the temperature of the metal terminal 16 increases as the application of a pulse current. Although depending on the material of the metal terminal 16, in order to achieve diffusion-bonding, when the metal terminal 16 is copper or when the external electrode 14 is copper, it is necessary to heat the same up to about 400° C. as shown in FIG. 17. Thus, the metal terminal 16 can be diffusion-bonded to the external electrode 14.

As shown in FIG. 17, when the metal terminal 16 is heated from normal temperature to about 400° C. in one current application, cracks developed in the ceramic element assembly 10 in some cases.

For example, a current is applied as shown in FIG. 17, cracks developed in the ceramic element assembly 10 in 8 ceramic elements 2 out of 10 ceramic elements 2.

Figure 18:
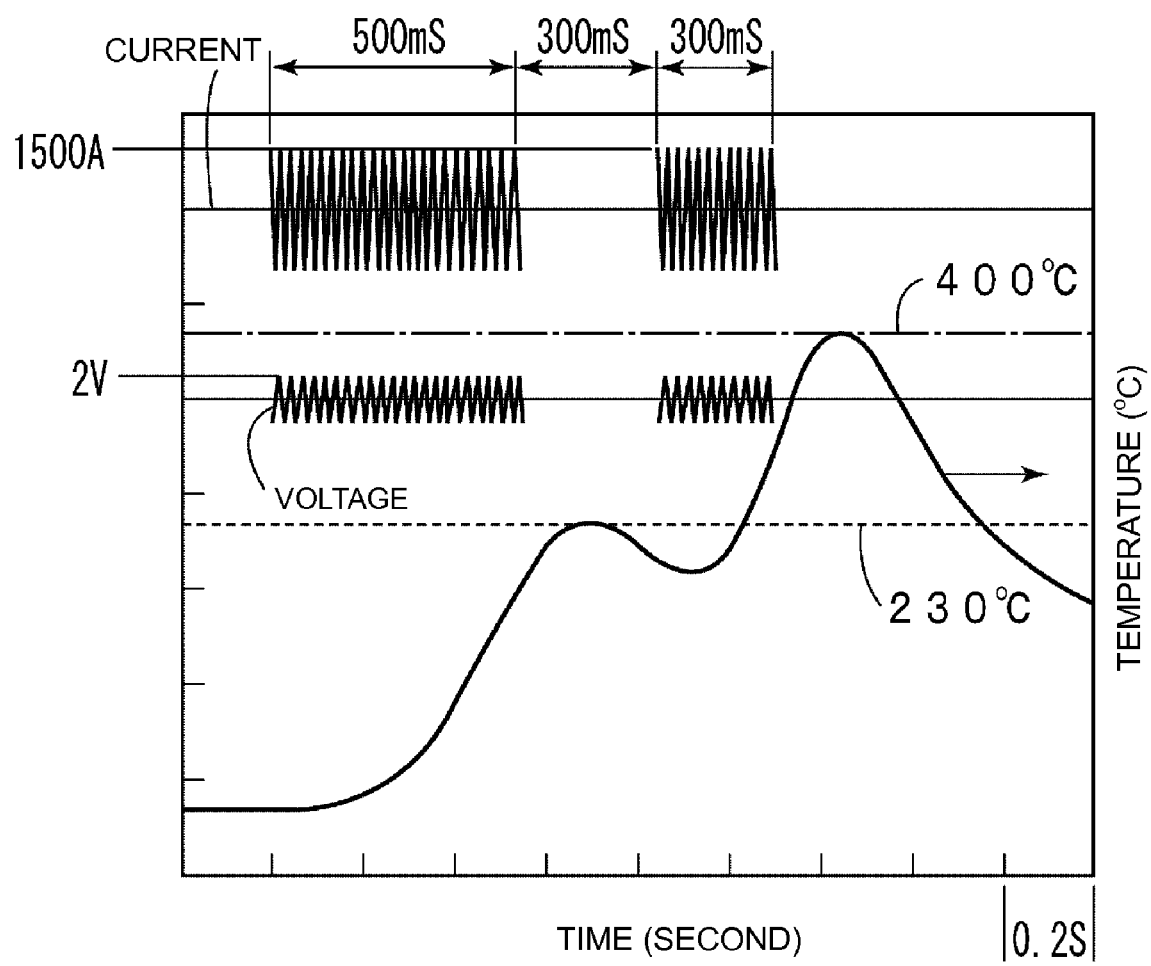
FIG. 18 is a view showing temperature changes of the metal terminal when a current is applied a plurality of times upon diffusion-bonding by a pulse heat system in a modified example of the manufacturing method according to a preferred embodiment of the present invention.

In contrast, the present inventors discovered that the development of cracks was suppressed when a current is applied a plurality of times while stopping the current application until the temperature reaches about 400° C., without heating from normal temperature to about 400° C. at one time. More specifically, it is revealed that when the metal terminal 16 is heated to about 230° C. by a first application of a pulse current, the application is once stopped, and then a pulse current is applied again about 0.3 second later to increase the temperature of the metal terminal 16 to about 400° C. as shown in FIG. 18, cracks hardly develop in the ceramic element assembly 10. According to the experiment, the development of cracks was not observed in 10 ceramic elements.

The difficulty of the development of cracks in the ceramic element assembly 10 when a current is applied a plurality of times as shown in FIG. 18 is possibly based on the reduction in stress in the ceramic element assembly 10 due to stopping of the heating after heated for a given time to about 230° C.

Therefore, in various preferred embodiments of the present invention, a current is applied a plurality of times when the metal terminals 16 and 17 are heated for diffusion-bonding.

In FIG. 18, a current is applied twice, but a current is applied 3 times or more until the temperature reaches the maximum temperature by heating.

More preferably, a temperature at which cracks are likely to develop in the ceramic element assembly 10 is measured by manufacturing the ceramic element 2, and then heating the metal terminal 16 by one current application. It is preferable to start a second current application after a current is applied to the metal terminal 16 so as to not reach the measured temperature, and then the current application is stopped. The method shows a temperature at which the current application needs to stop, e.g., about 230° C. in FIG. 18.

Figure 19:
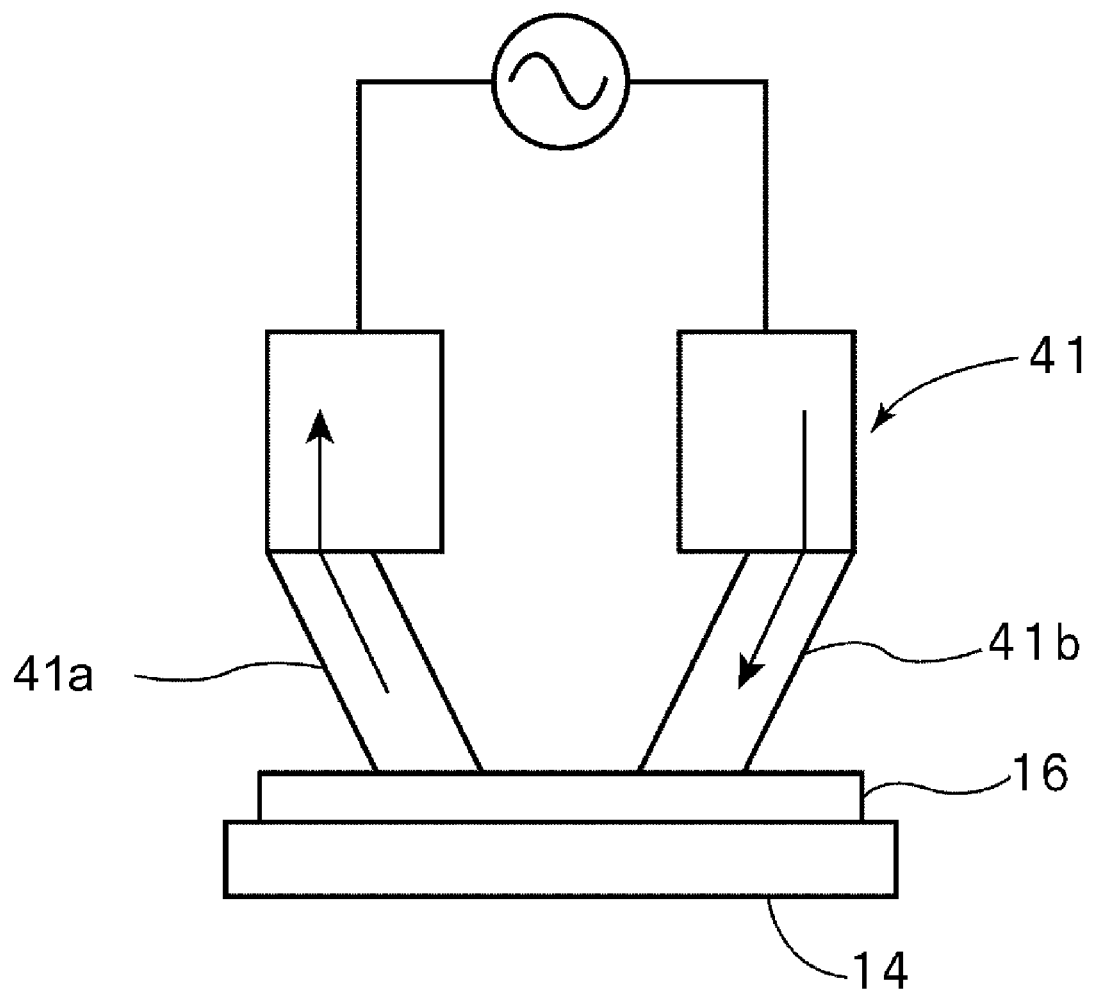
FIG. 19 is a schematic front view showing a heating method using a parallel gap system according to another modified example of the method for manufacturing a ceramic electronic component according to a preferred embodiment of the present invention.

The heating method is not limited to the heating method by a pulse heat system, for example, a heating method by a parallel gap system shown in FIG. 19 may be employed. Here, the terminal for diffusion-bonding 41 having a pair of probes 41a and 41b is used. The probes 41a and 41b are brought into contact with the metal terminal 16 at a given gap. Then, a current is applied as indicated by the arrow of FIG. 19 to heat the metal terminal 16 by contact resistance. Also in the heating method by a parallel gap system, the development of cracks in the ceramic element assembly can be minimized by applying a current a plurality of times.

As shown in FIGS. 17 and 18, the current application may be performed a plurality of times to reach the maximum temperature by heating. Depending on the composition of the ceramic element assembly 10 to be used and the materials of the metal terminal 16 and the external electrode 14, a current may be applied in such a manner as to reduce a temperature decrease rate at the time of temperature decrease in which a temperature decreases from the maximum temperature to normal temperature. This will be described with reference to FIGS. 20 and 21.

Figure 20:
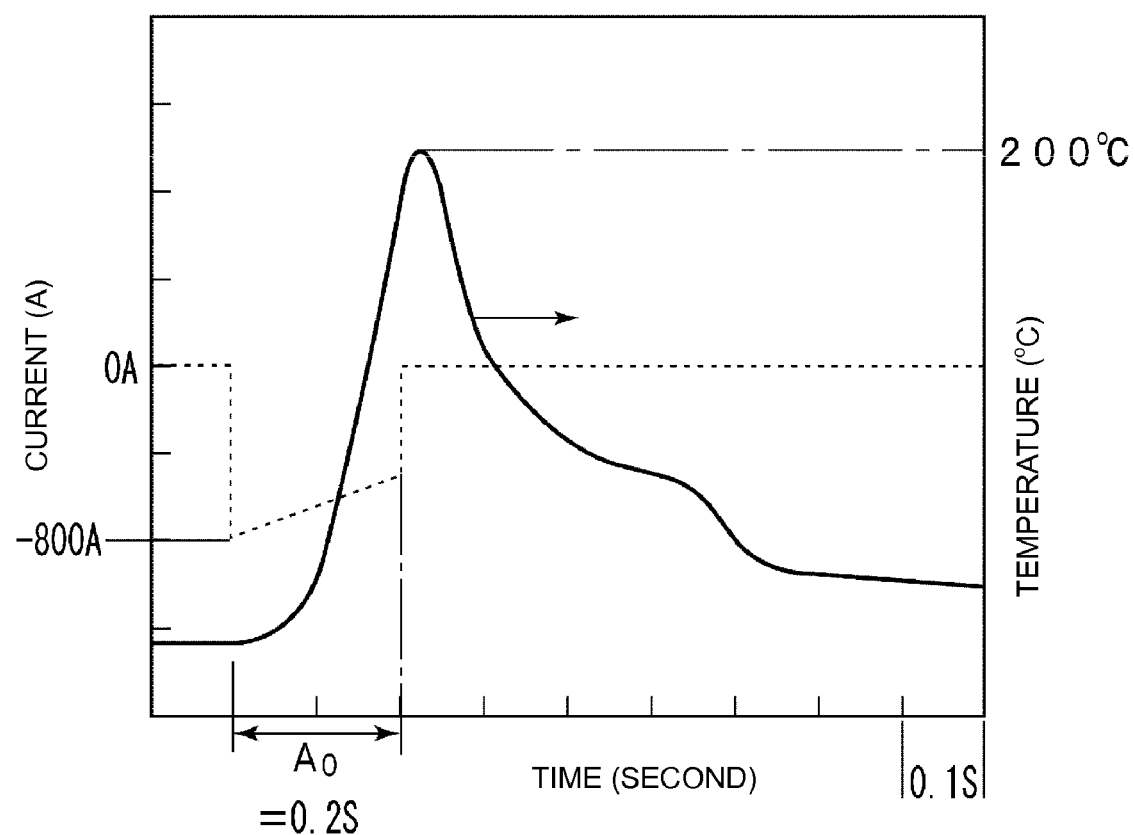
FIG. 20 is a view showing a relationship between an applied current when heating is performed by a parallel gap system upon diffusion-bonding and temperature changes of the metal terminal in the method for manufacturing a ceramic electronic component according to a preferred embodiment of the present invention.

In FIG. 20, the metal terminal 16 was heated using the ceramic element assembly 10 having a composition different from the case of FIG. 17 by a heating method by a parallel gap heating system. Here, a current was applied in a period of time from normal temperature to $A_0$ of FIG. 20 to increase the temperature of the metal terminal 16 to about 200° C. for diffusion-bonding. The welding time $A_0$ is about 0.2 second. One division of the abscissa of FIGS. 20 and 21 is about 0.1 second.

In this case, the current application was stopped before the temperature reaches about 200° C. as the maximum temperature. After reaching the maximum temperature, the temperature of the metal terminal 16 naturally decreases. Therefore, the temperature decrease rate is relatively high. In this case, the development of cracks due to shrinkage of the ceramic element assembly was sometimes observed in a period of temperature decrease.

Figure 21:
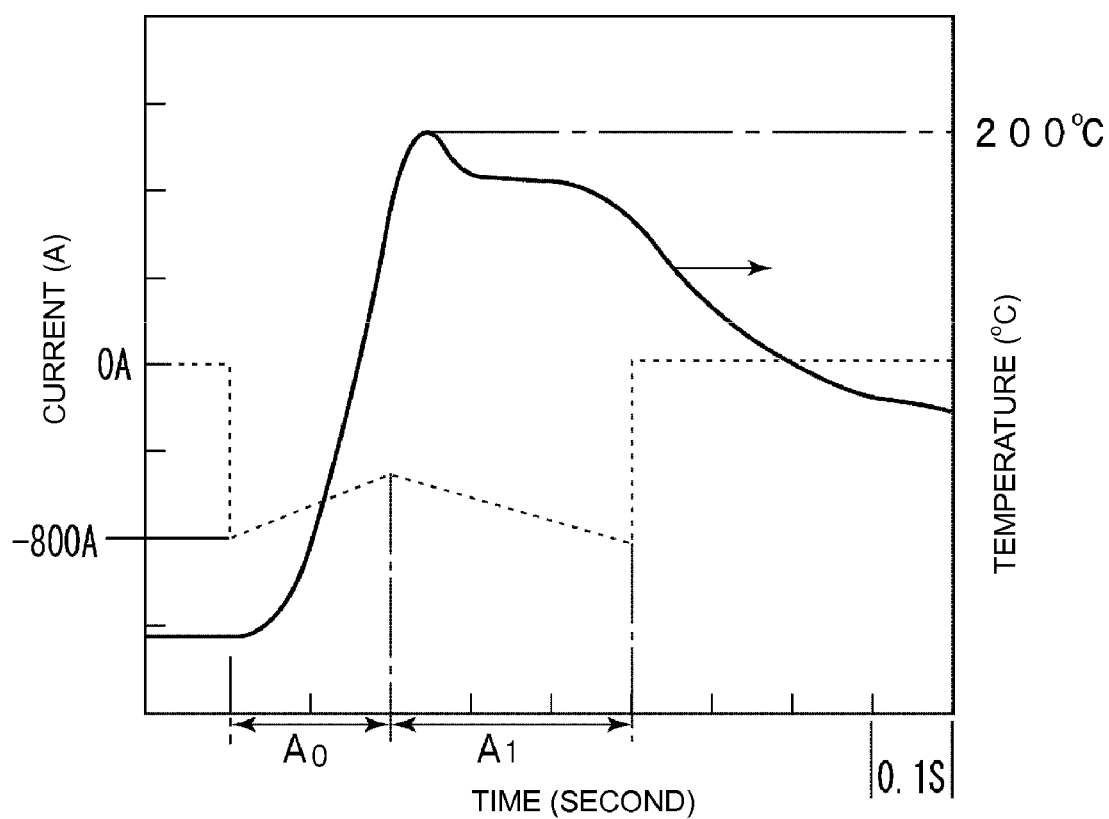
FIG. 21 is a view showing a relationship between an applied current, when heating is performed by a parallel gap system upon diffusion-bonding and a current is applied also in a period of temperature decrease, and temperature changes of the metal terminal in the method for manufacturing a ceramic electronic component according to a preferred embodiment of the present invention.

In contrast, as shown in FIG. 21, a current was applied only in a period of $A_0$ to increase the temperature to the maximum temperature by heating similarly as in FIG. 20, and then a smaller current was applied only in a period of $A_1$ in a period of temperature decrease to reduce a temperature decrease rate. In this case, the temperature decrease rate decreases to reduce a temperature gradient in a period of temperature decrease. Therefore, the development of cracks due to shrinkage was not observed in the ceramic element assembly. Thus, depending on the composition of the ceramic element assembly 10 and the material of the metal terminal 16, the development of cracks in the ceramic element assembly 10 can be minimized by heating also in a period of temperature decrease to decrease the temperature decrease rate.

Therefore, in various preferred embodiments of the present invention, it is preferable to bring the terminal arranged to provide diffusion-bonding into contact with the metal terminal, and apply a current a plurality of times when diffusion-bonding is performed by heating in a state where the external electrode and the metal terminal are brought into contact with each other. The plurality of current applications may be performed throughout the entire diffusion-bonding process. As shown in FIG. 18, the current application may be performed a plurality of times in a process until a temperature reaches the maximum temperature. As shown in FIG. 21, the current application may be performed a plurality of times before and after reaching the maximum temperature.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A ceramic electronic component, comprising:
   a ceramic element assembly;
   an external electrode arranged on a surface of the ceramic element assembly and including a sintered metal; and
   a metal terminal electrically connected to the external electrode; wherein
   the external electrode and the metal terminal are directly diffusion-bonded to one another by diffusion of metal in the metal terminal into the external electrode; and the metal terminal includes a terminal body and a plating film arranged on the terminal body, and the external electrode and the metal terminal are directly diffusion-bonded to one another by diffusion of both metal in the terminal body and metal in the plating film into the external electrode.

2. The ceramic electronic component according to claim 1, wherein the plating film includes a lower plating film disposed on the terminal body and an upper plating film disposed on the lower plating film.

3. The ceramic electronic component according to claim 2, wherein each of the terminal body and the lower plating film includes at least one of Ni, Fe, Cu, Ag, Cr, or an alloy containing at least one of the metals as a main component, and the upper plating film includes at least one of Sn, Ag, Au, or an alloy containing at least one of the metals as a main component.

4. The ceramic electronic component according to claim 2, wherein the external electrode includes at least one of Cu, Ni, Ag, Pd, or an alloy containing at least one of the metals as a main component.

5. The ceramic electronic component according to claim 1, further comprising an anti-corrosion film arranged to cover an exposed portion of the outer surface of the external electrode.

6. The ceramic electronic component according to claim 1, wherein the external electrode and the metal terminal are diffusion-bonded to one another at a plurality of locations.

7. The ceramic electronic component according to claim 6, wherein the metal terminal is diffusion-bonded to the external electrode, and the metal terminal includes a plurality of filament-shaped terminal portions disposed substantially in parallel to each other.

8. The ceramic electronic component according to claim 1, wherein the ceramic element assembly has a first end surface and a second end surface that are mutually opposite to one another, the external electrode has a first external electrode that covers the first end surface and a second external electrode that covers the second end surface, and the metal terminal has a first metal terminal electrically connected to the first external electrode and a second metal terminal electrically connected to the second external electrode.

9. The ceramic electronic component according to claim 1, wherein the surface of the external electrode is not covered with a plating film.

* * * * *